United States Patent
Sun et al.

(10) Patent No.: US 11,556,759 B2
(45) Date of Patent: Jan. 17, 2023

(54) COMPARISON OF BIOMETRIC IDENTIFIERS IN MEMORY

(71) Applicant: Micron Technology, Inc., Boise, ID (US)

(72) Inventors: Honglin Sun, Boise, ID (US); Glen E. Hush, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 660 days.

(21) Appl. No.: 16/533,423

(22) Filed: Aug. 6, 2019

(65) Prior Publication Data
US 2021/0042608 A1    Feb. 11, 2021

(51) Int. Cl.
*G06N 3/04* (2006.01)
*G06N 3/063* (2006.01)
(Continued)

(52) U.S. Cl.
CPC ......... *G06N 3/0454* (2013.01); *G06N 3/0635* (2013.01); *G06V 40/70* (2022.01);
(Continued)

(58) Field of Classification Search
CPC ...... G06N 3/0454; G06N 3/0635; G06N 3/08; G06N 3/063; G06V 40/70; G06V 40/166;
(Continued)

(56) References Cited

U.S. PATENT DOCUMENTS 5,050,095 A    9/1991    Samad
7,043,466 B2   5/2006    Watanabe et al.
(Continued)

FOREIGN PATENT DOCUMENTS

KR    10-2018-0046832 A    5/2018
WO    2018-117940 A1       6/2018

OTHER PUBLICATIONS

International Search Report and Written Opinion from related International PCT Application No. PCT/US2020/040479, dated Oct. 15, 2020, 13 pages.

*Primary Examiner* — Nimesh Patel
(74) *Attorney, Agent, or Firm* — Brooks, Cameron & Huebsch, PLLC

(57) ABSTRACT

Systems, apparatuses, and methods related to comparison of biometric identifiers in memory are described. An example apparatus includes an array of memory cells, a plurality of logic blocks in complementary metal-oxide-semiconductor (CMOS) under the array, and a controller coupled to the array of memory cells. The controller is configured to control a first portion of the plurality of logic blocks to receive a first subset of a set of biometric identifiers from the array and to perform a first comparison operation thereon and control a second portion of the logic blocks to receive a second subset of the set of biometric identifiers from the array and to perform a second comparison operation thereon. The first and second subsets of the biometric identifiers are different biometric identifiers and the first and second comparison operations are performed to determine a match of the first and second subsets respectively to a stored template.

24 Claims, 6 Drawing Sheets

(51) Int. Cl.
*H01L 27/118* (2006.01)
*G06V 40/70* (2022.01)
*G06N 3/08* (2006.01)

(52) U.S. Cl.
CPC .......... *H01L 27/11807* (2013.01); *G06N 3/08* (2013.01); *H01L 2027/11838* (2013.01)

(58) Field of Classification Search
CPC .... G06V 40/171; G06V 40/172; G06V 40/50; H01L 27/11807; H01L 2027/11838; G06K 9/627; G06K 9/00771; G06K 9/00288; G06K 9/00255; G06K 9/00362; G06K 9/00; G06K 9/00228; G06K 9/00261; G06K 9/00335; G06K 2009/00322; G06K 2009/00939; G06K 9/00221; G06K 9/00281; G06K 9/2018; G01J 5/0025; G08B 13/19656; G08B 13/19602; G08B 13/196; G08B 13/19628; G08B 15/002; G08B 3/10; G08B 5/36; H04N 7/186; H04N 5/33; A61B 5/01; A61B 2576/00; A61B 5/0035; A61B 5/0077; A61B 5/015; G07C 9/00; G07C 9/30; G07C 9/00563; G16H 50/30; G16H 50/80

See application file for complete search history.

(56) References Cited

U.S. PATENT DOCUMENTS

| | | |
|---|---|---|
| 2004/0073764 A1 | 4/2004 | Andreasson |
| 2007/0025722 A1* | 2/2007 | Matsugu ............ H04N 5/23222 348/E5.042 |
| 2012/0262275 A1 | 10/2012 | Schultz |
| 2018/0007553 A1 | 1/2018 | Dutt et al. |
| 2018/0012006 A1 | 1/2018 | Suh et al. |
| 2018/0335347 A1* | 11/2018 | Herrmann ............... G01J 5/068 |
| 2019/0333233 A1* | 10/2019 | Hu ....................... G08B 21/182 |
| 2021/0080327 A1* | 3/2021 | Tu ............................. G01J 5/12 |

* cited by examiner

COMPARISON OF BIOMETRIC IDENTIFIERS IN MEMORY

TECHNICAL FIELD

The present disclosure relates generally to memory, and more particularly to apparatuses and methods associated with comparison of biometric identifiers in memory.

BACKGROUND

Memory devices are typically provided as internal, semiconductor, integrated circuits in computers or other electronic devices. Some memory systems may include non-volatile storage memories for storing host (e.g., user) data from a host. Non-volatile storage memories provide persistent information (data) by retaining stored data when not powered. Some types of non-volatile memory and may include NAND flash memory, NOR flash memory, read only memory (ROM), Electrically Erasable Programmable ROM (EEPROM), Erasable Programmable ROM (EPROM), and resistance variable memory, such as phase change random access memory (PCRAM), three-dimensional cross-point memory (e.g., 3D XPoint), resistive random access memory (ReRAM), ferroelectric random access memory (FeRAM), magnetoresistive random access memory (MRAM), and programmable conductive memory, among other types of memory. Volatile memory cells (e.g., dynamic random access memory (DRAM) cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

Artificial neural networks (ANNs) are networks that may process the information by modeling a network of neurons, such as neurons in a human brain, to process information (e.g., stimuli) that has been sensed in a particular environment. Similar to a human brain, neural networks include a multiple neuron topology.

DETAILED DESCRIPTION

Figure 1:
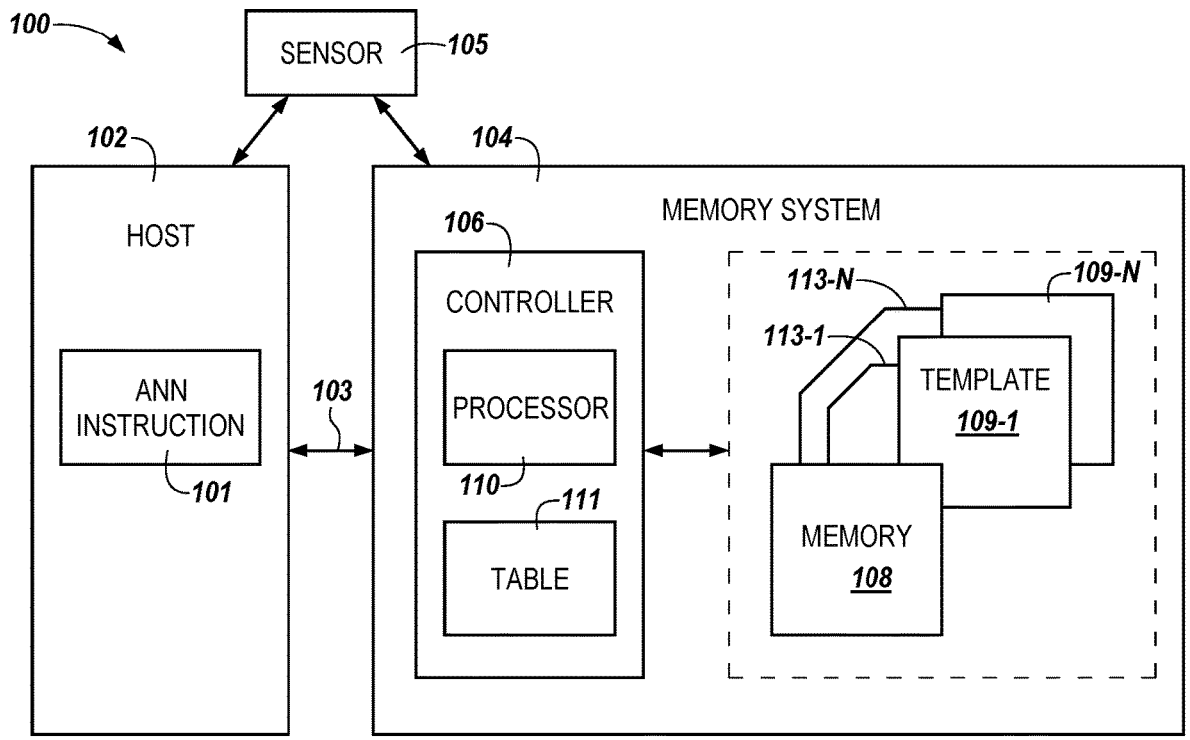
FIG. 1 is a block diagram of an apparatus in the form of a computing system including a host and a memory system in accordance with a number of embodiments of the present disclosure.

Biometrics is a term used for information (e.g., measurements, calculations, and/or identification) based on metrics (e.g., measurable characteristics) related to a biological source. The biological source may be a particular identifiable individual (e.g., human, animal, or plant, etc.) from which the characteristics have been sensed. Hence, biometrics may, for example, allow a particular person to be identified and/or authenticated based upon recognizable and verifiable data, which may be unique and specific to the person. Biometrics may be used as a form of identification and access control. For example, using computer technology, biometrics may be used to identify individuals in groups (e.g., that are under surveillance) or it may be used for authentication of an individual to gain access to a particular area, business, agency, and laboratory, etc., among other possible uses.

Biometric identifiers are measurable characteristics that may be used to distinguish, identify, label, and/or describe individuals. Biometric identifiers may be categorized as physiological versus behavioral characteristics. Physiological characteristics are related to a morphological trait (e.g., a physical shape of a somatic feature) or an outcome of an inherent physiological process of an individual that is usable to distinguish a particular individual from other individuals. Examples of such types of biometric identifiers include, but are not limited to, recognition of facial features (e.g., shapes and/or textures of nose, mouth, ears, etc.), fingerprints, sections of deoxyribonucleic acid (DNA) structure and/or coding, vein structures and/or prints of lines, folds, creases, etc., on a palm of a hand, features of an iris and/or retina of the eye, and/or a body odor, among other possible physiological characteristics. Behavioral characteristics are related to recognizable patterns of behavior that may be usable for distinguishing and/or recognizing a particular individual. Examples of such types of biometric identifiers include, but are not limited to, typing rhythm, gait (e.g., a style of walking, running, etc.), and/or voice (e.g., tone, inflection, etc.), among other possible behavioral characteristics. Some biometric identifiers may be a combination of physiological and behavioral characteristics (e.g., odor, gait, voice, etc.). These types of biometric identifiers may be used for recognition of (e.g., to identify) a particular individual as a source of one or more of the biometric identifiers.

To authenticate and/or identify a particular individual, one or more of such biometric identifiers (e.g., sets of data that code such types of biometric identifiers) may be compared, as described herein, to a stored template of predetermined biometric identifiers. For example, to authenticate an individual, one or more biometric identifiers may be sensed by a sensor and the sensed biometric identifiers may be compared to the template that stores predetermined biometric identifiers for at least that particular individual. Alternatively, to identify a particular individual from among multiple other individuals (e.g., in an image of a group of people), one or more biometric identifiers sensed from that particular individual may be compared to one or more templates that store predetermined biometric identifiers for that particular individual and that also store biometric identifiers for multiple other individuals.

Other means of authentication and identification include token-based systems, such as a driver's license or passport, and knowledge-based systems, such as a password or personal identification number. However, such means may be stolen, misplaced, and/or forgotten. Because one or more biometric identifiers that are compared to appropriate stored template(s) may provide a resulting identification that is statistically unique to a particular individual (e.g., without that individual's active participation), use of biometrics is more reliable in verifying identity than token and knowledge-based methods. Faced with threats of, for example, larceny, identity theft, document fraud, terrorism, cybercrime, and changes in international regulations, biometrics is a means of identifying and authenticating individuals. Such identification and authentication may be performed in a reliable, efficient, and fast manner through unique physiological and/or behavioral characteristics used in a computing system for comparison of biometric identifiers.

Effective use of biometric identifiers is application dependent. Use of certain biometric identifiers and/or numbers of biometric identifiers may be better than others based on desired levels of certainty, convenience, and/or security. Comparison of a single biometric identifier with a template may not meet the desired level in every implementation. Hence, the comparison in memory of biometric identifiers with the template(s) described herein enables efficient use of various types of biometric identifiers by enabling selection from a number of levels (e.g., layers) of an artificial neural network (ANN) in the memory that correspond to multiple types of biometric identifiers. For example, a first layer of the ANN may correspond to comparison of, for example, facial feature biometrics, a second layer of the ANN may correspond to comparison of fingerprint biometrics, and a third layer of the ANN may correspond to comparison of biometrics of an iris an eye, among various other layers that may correspond to any number of possible additional and/or alternative biometrics.

The present disclosure includes systems, apparatuses, and methods related to comparison of biometric identifiers in memory. An example apparatus includes an array of memory cells, a plurality of logic blocks in complementary metal-oxide-semiconductor (CMOS) under the array, and a controller coupled to the array of memory cells. The controller is configured to control a first portion of the plurality of logic blocks to receive a first subset of a set of biometric identifiers from the array and to perform a first comparison operation thereon and to control a second portion of the logic blocks to receive a second subset of the set of biometric identifiers from the array and to perform a second comparison operation thereon. The first and second subsets of the biometric identifiers are different biometric identifiers and the first and second comparison operations are performed to determine a match of the first and second subsets respectively to a stored template.

The figures herein follow a numbering convention in which the first digit or digits correspond to the drawing figure number and the remaining digits identify an element or component in the drawing. Similar elements or components between different figures may be identified by the use of similar digits. For example, reference numeral 108 may reference element "08" in FIG. 1, and a similar element may be referenced as 208 in FIG. 2. In some instances, a plurality of similar, but functionally and/or structurally distinguishable, elements or components in the same figure or in different figures may be referenced sequentially with the same element number (e.g., 109-1 and 109-N in FIG. 1). Additionally, designators such as "N," as used herein, particularly with respect to reference numerals in the drawings, may indicate that a number of the particular feature so designated, which may be more than the number shown in the drawing, may be included with a number of embodiments of the present disclosure. For example, reference numeral 524-N in FIG. 5 may indicate that more than the four sets of logic blocks shown may be included in the ANN 525.

FIG. 1 is a block diagram of an apparatus in the form of a computing system 100 including a host 102 and a memory system 104 in accordance with a number of embodiments of the present disclosure. As used herein, an "apparatus" may refer to, but is not limited to, a variety of structures or combinations of structures. For instance, host 102 and memory system 104 each might also be separately considered an "apparatus."

In this example, the computing system 100 includes host 102 coupled to memory system 104 via an interface 103. The host 102 may be a personal laptop computer, a desktop computer, a digital camera, a mobile telephone, a memory card reader, or an Internet-of-Things (IoT) enabled device, among various other types of systems. The host 102 may include a number of processing resources (e.g., one or more processors, microprocessors, or some other type of controlling circuitry) capable of accessing memory system 104. The host 102 may include a system motherboard and/or backplane and may include a number of processing resources (e.g., one or more processors, microprocessors, or some other type of controlling circuitry).

The system 100 may include separate integrated circuits or both the host 102 and the memory system 104 may be on the same integrated circuit. The system 100 may be, for instance, a server system and/or a high performance computing (HPC) system and/or a portion thereof. Although the example shown in FIG. 1 illustrates a system having a Von Neumann architecture, embodiments of the present disclosure may be implemented in non-Von Neumann architectures, which may not include one or more components (e.g., CPU, ALU, etc.) often associated with a Von Neumann architecture.

The host 102 may include instructions that may be provided to memory system 104 via interface 103. As an example, the instructions may include ANN instructions 101 that may enable, when provided to memory system 104, the memory system 104 to perform various ANN operations using an ANN (e.g., as shown at 525 and 625 and described in connection with FIGS. 5 and 6 and elsewhere herein) in a memory device 108. Although one such memory device is shown in FIG. 1, more than one memory device (collectively referred to as memory device 108) may be included in memory system 104. For example, the number of memory devices may, in a number of embodiments, correspond to a number of stored templates 109-1, . . . , 109-N that may be used for comparison of biometric identifiers, as described herein.

The interface 103 coupling host 102 to memory system 104 may include, for example, a physical interface (e.g., a data bus, an address bus, and a command bus, or a combined data/address/command bus) employing a suitable protocol. Such protocol may be custom or proprietary, or the interface 103 may employ a standardized protocol, such as Peripheral Component Interconnect Express (PCIe), Gen-Z interconnect, cache coherent interconnect for accelerators (CCIX), or the like.

The memory system 104 includes controller 106 and the memory device 108. The controller 106 may include a state machine, a sequencer, and/or some other type of control circuitry, and may include hardware and/or firmware (e.g., microcode instructions) in the form of an application specific integrated circuit (ASIC), field programmable gate array, etc. The controller 106 may be located local to each memory device 108. Stated differently, although one controller 106 is illustrated in FIG. 1, the memory system 104 may include a plurality of controllers each being located local to each of a respective plurality of memory devices 108.

The memory device 108 may include memory cells arranged in rows coupled by access lines (which may be referred to as word lines or select lines) and columns coupled by sense lines (which may be referred to as digit lines or data lines). The array of memory cells may be, but not be limited to, a DRAM array, SRAM array, STT RAM array, PCRAM array, TRAM array, RRAM array, NAND flash array, and/or NOR flash array, for instance. The memory device 108 may be in the form of a plurality of individual memory die and/or distinct memory layers (e.g., as described further herein) formed as integrated circuits on a chip.

In a number of embodiments, the memory device 108 may be three-dimensional (3D) and may include multiple layers stacked together. As an example, memory device 108 may include a first layer including a logic component (e.g., logic blocks, row drivers, and/or column drivers, as described in connection with FIG. 4), and a second layer stacked on the first layer and including a memory component such as an array or memory cells (e.g., as described in connection with FIG. 3).

Although not shown in FIG. 1, the memory system 104 also may include a decoder (e.g., row/column decoders) that may be controlled by the controller 106 to decode address signals received from the host 102, for instance. The decoded address signals may be further provided, via the controller 106, to the row/column drivers, which may activate row/columns of an array of memory cells of the memory device 108.

The controller 106 may map physical locations (e.g., addresses) of respective logic (e.g., logic 422 in a logic block 416 as described in connection with FIG. 4) and/or memory cells of memory device 108 to respective logical addresses and may store the mapping information in a lookup table 111. Using the lookup table 111, the controller 106 may access, accordingly, logic and/or memory cells of the memory device 108 and/or track a topology of an ANN implemented within the memory device 108 by using the mapping information stored in the lookup table 111.

In a number of embodiments, the controller 106 may configure various portions of the memory device 108 as multiple ANNs and perform, in response to receiving ANN instructions 101, respective ANN operations using the memory device 108 configured as ANNs. As used herein, an ANN operation refers to an operation that performs a given task by processing inputs using artificial neurons. The term "configuring" refers to designating a group of elements as elements of the same network. For example, a particular set of logic blocks may be configured as an ANN, such that the particular set of logic blocks is utilized, for example, for performing a comparison operation to match biometric identifiers requested to be performed via the ANN. In a number of embodiments, the ANN operation may involve performing various machine learning algorithms to process the inputs. Other tasks that may be processed by performing ANN operations may include computer sensing, speech recognition (e.g., from a user), machine translation, and/or social network filtering, among other possible tasks.

An example of computer sensing is shown at sensor 105. Sensor 105 may be configured to sense a set of biometric identifiers from a source (not shown). Sensor 105 may, in a number of embodiments, be one or more image recording devices (e.g., cameras) as a first modality that provides static images (e.g., photographs) and/or one or more dynamic image recording devices as a second modality that provides dynamic images (e.g., videos) to enable extraction and storage of biometric identifiers. Other types of sensors also may be utilized as various types of modalities, as appropriate to the type of biometric identifiers being sensed. The other types of modalities (e.g., sensors) may, in a number of embodiments, include a sound recording device to enable extraction and storage of biometric identifiers related to voice recognition and an odor sensing device to enable extraction and storage of biometric identifiers related to body odor, although the other types of sensors are not so limited. Operation of the sensor 105 may be directed by the host 100 and/or the ANN instructions 101 to sense the appropriate type(s) of biometric identifiers of a source (e.g., an individual to be identified and/or authenticated). The sensed image, for example, including the biometric identifiers may be sent from the sensor 105 to the memory system 104.

The controller 106 and/or the memory device 108 of the memory system 104 may, in a number of embodiments, include a processor 110. The processor 110 may be configured to selectably store input of a set of biometric identifiers in subsets of memory cells in the array of the memory device 108. The subsets of memory cells may correspond to respective subsets of the set of biometric identifiers. For example, in a facial recognition operation, such subsets may include a first subset of biometric identifiers related to a nose of an individual that is stored in a corresponding first subset of memory cells and a second subset related to a mouth of the individual that is stored in a corresponding second subset of memory cells, among other possible subsets.

The processor 110 may be further configured to selectably determine from the set of biometric identifiers a type of input to be identified. The set of biometric identifiers in an image, for example, provided by the sensor 105 (e.g., sensed based on being directed by the host 100 and/or the ANN instructions 101) may enable the processor 110 to determine the type of biometric comparison being performed. The biometric identifiers in the image may indicate that the type is, for example, facial features, fingerprints, DNA, veins and/or prints of a palm of a hand, features of an iris and/or retina of the eye, gait, etc.

In addition to the multiple subsets of memory cells described above for storage of subsets of particular biometric identifiers related to facial recognition, the processor 110 may be further configured to selectably store input of sets of biometric identifiers in separate subsets of memory cells in the array based on the determined types of biometric identifiers. For example, biometric identifiers for facial features, fingerprints, DNA, veins and/or prints of a palm of a hand, features of an iris and/or retina of the eye, gait, etc., may each be separately stored in corresponding subsets of the memory cells in the array.

The processor 110 may be further configured to determine from the type of input a plurality of subsets of the biometric identifiers (e.g., stored in particular subsets of memory cells) to be compared to a particular template of the plurality of templates 109-1, . . . , 109-N for identification and/or authentication. For example, a first type of biometric identifier stored in a subset or subsets of memory cells on the memory device 108 may be compared to stored template 109-1, which may be stored on the memory device 108 or on a different memory resource (not shown). When stored on the different memory resource, the stored template 109-1 may be coupled 113-1 (e.g., via a bus) to the memory device 108. A second type of biometric identifier stored in a different subset or subsets of memory cells on the memory device 108 may be compared to stored template 109-N. When stored on the different memory resource, the stored template 109-N may be coupled 113-N to the memory device 108. Alternatively or in addition, for example, for authentication, the template may be stored on a portable memory resource (not shown) presentable to the system 100 (e.g., the host 102 and/or the sensor 105). The portable memory resource may, in a number of embodiments, be an identification card, a personal digital assistant (PDA), etc., configured to store such a template.

An ANN may be implemented within memory device 108 at various granularities. In an example in which the memory device 108 includes multiple logic blocks (e.g., sets 524 of logic blocks 516 of an ANN 525 as described in connection with FIG. 5), an ANN may be implemented within a single logic block and/or over multiple logic blocks and/or memory devices (e.g., memory devices 108). Each set of logic blocks of an ANN implemented within a memory device may be operated independently from each other such that, for example, a plurality of ANN operations may be performed concurrently.

Figure 2:
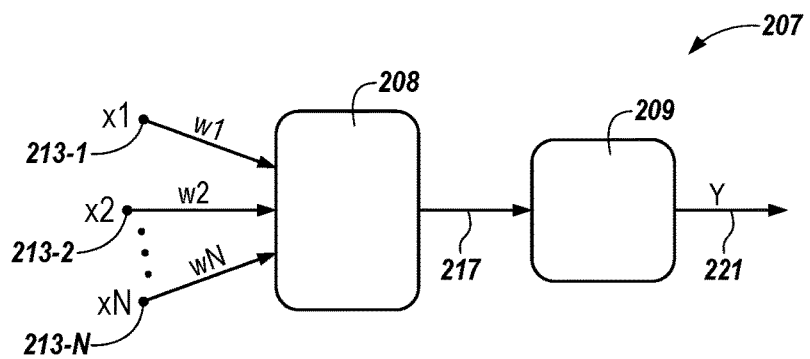
FIG. 2 a block diagram of an example of comparison of biometric identifiers in memory in accordance with a number of embodiments of the present disclosure.

FIG. 2 is a block diagram of an example of comparison (e.g., using a number of comparison operations 207) of biometric identifiers 213 in memory in accordance with a number of embodiments of the present disclosure. A number of coded inputs x1, x2, . . . , xN (e.g., binary digits) corresponding to a set of biometric identifiers 213-1, 213-2, . . . , 213-N (collectively referred to as biometric identifiers 213) may be input from a sensor to the memory system for storage by a corresponding number of subsets of memory cells in the memory device 208. As described further herein, an ANN operation 217 may be performed on at least some of the biometric identifiers 213 for comparison 207 to corresponding types of biometric identifiers stored by the template 209. As used herein, an ANN operation may be referred to as a comparison operation 207 or multiple comparison operations 207, depending on the context. An indicator "Y" of whether a match has been determined by the ANN operation 217 performed between at least some of the biometric identifiers 213 and the biometric identifiers stored by the template 209 may be output 221 as a result of the ANN operation 217. In a number of embodiments, an indicator "Y" of a match being determined also may correspond to output 221 of an identification and/or authentication of a source (e.g., a particular individual) sensed by the sensor 105.

An ANN and corresponding sets of logic blocks (e.g., ANN 525 and corresponding sets 524 of logic blocks 516 as described in connection with FIG. 5) may be a network of artificial neurons that may be used to mimic biological neurons (e.g., of a human brain). Such artificial neurons may sometimes be referred to as perceptrons. The coded inputs x1, x2, . . . , xN corresponding to the set of biometric identifiers, which may be referred to as stimuli, may be respectively applied as input to one or more of the artificial neurons of the ANN. Signals, such as voltages, currents, or particular data values (e.g., binary digits), corresponding to the coded inputs x1, x2, . . . , xN may be generated responsive to sensing the biometric identifiers from a source and such signals may be stored by the memory device 208 and input to circuitry of the ANN for performance of the ANN operation 217.

Figure 3:
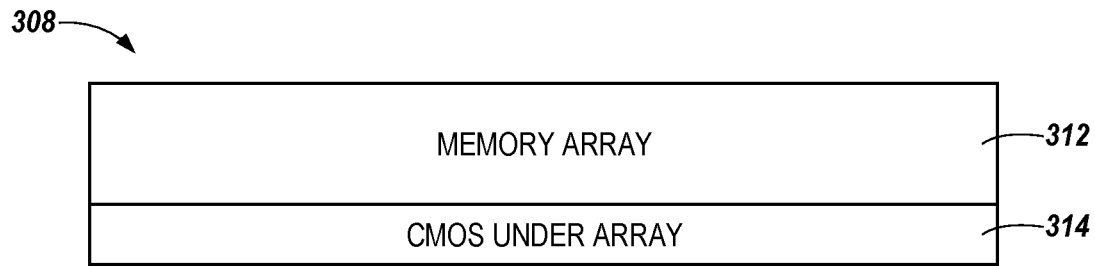
FIG. 3 is a block diagram of an example memory device including a plurality of layers in accordance with a number of embodiments of the present disclosure.

FIG. 3 is a block diagram of an example memory device 308 including a plurality of layers in accordance with a number of embodiments of the present disclosure. The memory device 308 may be analogous to memory device 108 and 208 previously described in connection with FIGS. 1 and 2.

The memory device 308 illustrated in FIG. 3 is intended to represent a 3D memory device including multiple layers stacked together. As an example, a second layer 312 of the memory device 308 is stacked over (e.g., on) a first layer 314 of the memory device 308. An array of memory cells may be formed within the second layer 312. The array may be or include a DRAM device that includes DRAM memory cells. The array may, in a number of embodiments, be or include other types of memory devices, such as SRAM, STT RAM, PCRAM, TRAM, RRAM, NAND, and/or NOR, among other possibilities.

A first set of logic blocks (e.g., logic blocks 516 illustrated in FIG. 5) may be formed within the first layer 314. The logic blocks are configured to perform various ANN operations, for example, using data values for biometric identifiers stored in the array 312 of memory cells for comparison to a stored template. The first set of logic blocks in the first layer 314 may be formed as a complementary metal-oxide-semiconductor (CMOS) under the array 312. As further illustrated in connection with FIG. 4, each logic block also may include row/column drivers. As described in connection with FIGS. 5 and 6, the memory device 308 also may include a plurality of sets of logic blocks and/or layers thereof. For example, each set and/or layer of logic blocks may correspond to comparison of a respective type of biometric identifiers with an appropriate template. In a number of embodiments, a first type of biometric identifier may be a set of biometric identifiers for facial recognition and a second type of biometric identifier may be a set of biometric identifiers for fingerprint recognition.

Figure 4:
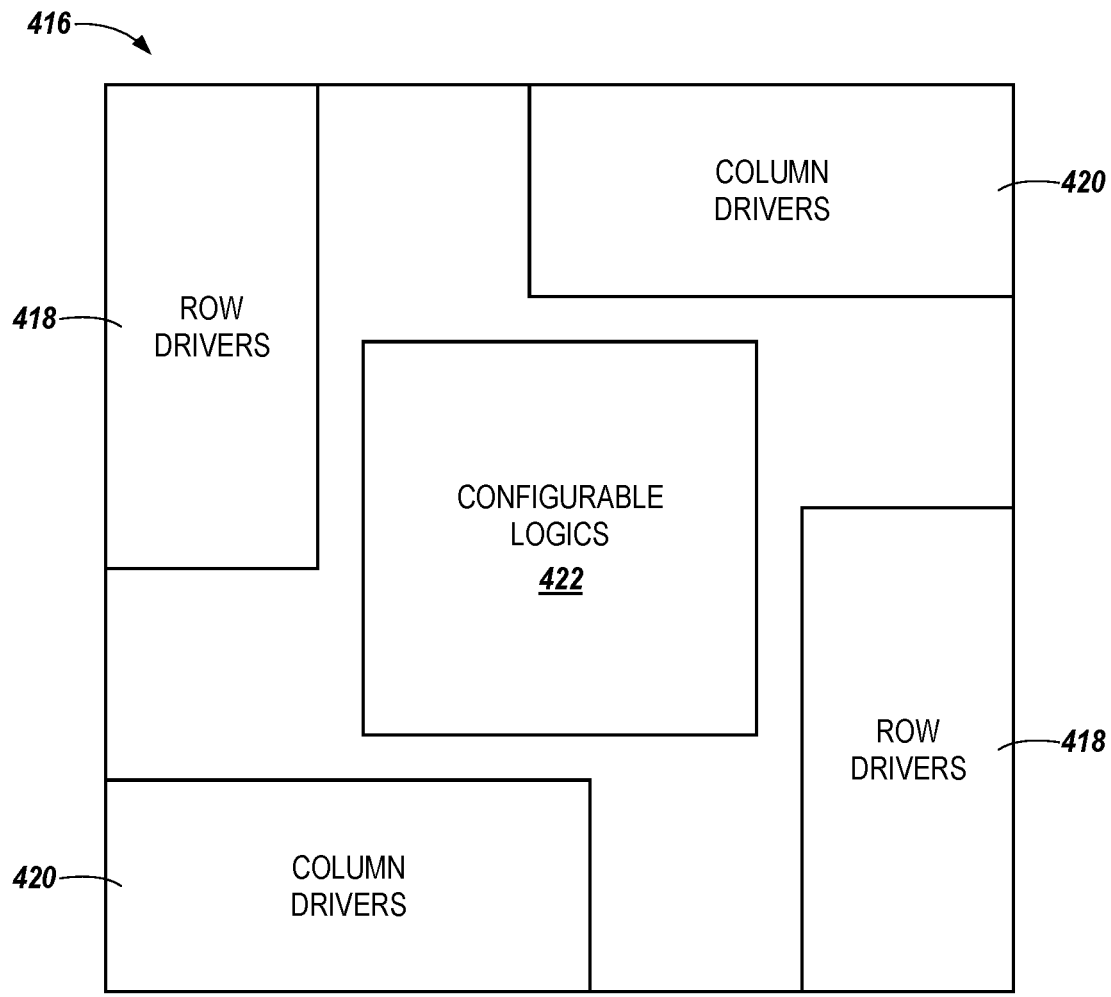
FIG. 4 is a block diagram of an example logic block of a memory device in accordance with a number of embodiments of the present disclosure.

FIG. 4 is a block diagram of an example logic block 416 of a memory device in accordance with a number of embodiments of the present disclosure. As described in connection with FIG. 3, the logic block 416 may be one of a plurality of logic blocks included within a memory device such as memory device 108, 208, and/or 308 as previously described in connection with FIGS. 1, 2, and 3, respectively.

At least one of (e.g., any or all of) the plurality of logic blocks may be a configurable logic block (CLB). A logic block may be a CLB that is a fundamental building block of a field programmable gate array (FPGA). A FPGA refers to a chip having an ability to change its data paths (e.g., topology) and/or be reprogrammed while in the field. For example, a logic block, a set of logic blocks, and/or a number of portions of a set of logic blocks may be programmed or reprogrammed during fabrication and/or in the field. With such an ability, the CLB may be flexibly programmed for or switched between comparison of different types of biometric identifiers (e.g., with an appropriate corresponding template). For example, a CLB that has been functioning as a microprocessor for comparison of facial features may be reprogrammed, while in the field, to function as a microprocessor for features of a retina of the eye, among other possibilities.

As illustrated in FIG. 4, the logic block 416 includes a logic 422. The logic 422 may be a lookup table (LUT)-based logic. For example, a physical location (e.g., address) of the logic 422 may be mapped to a logical address and the mapping information may be stored in a lookup table (e.g., the lookup table 111 illustrated in FIG. 1).

The logic block 416 may further include row drivers 418 and column drivers 420 that may be enabled to activate a row (or rows) and/or a column (or columns) of a memory array (e.g., memory array 312 previously described in connection with FIG. 3). As described herein, row drivers 418 and column drivers 420 may receive address signals decoded by respective row decoders and column decoders that are controllable by a controller, such as controller 106 previously described in connection with FIG. 1. Although not shown in FIG. 4, the logic block 416 also may include (e.g., be coupled to) a plurality of data buses (e.g., as shown at 530-0, 530-1, . . . , 530-N and described in connection with FIG. 5) that may couple logic block 416 to another logic block and/or to another external device (e.g., a device such as controller 106 located external to memory device 308). A data bus of the logic block 416 that couples the logic block 416 to another logic block may include an interconnect fiber, as further described below.

Figure 5:
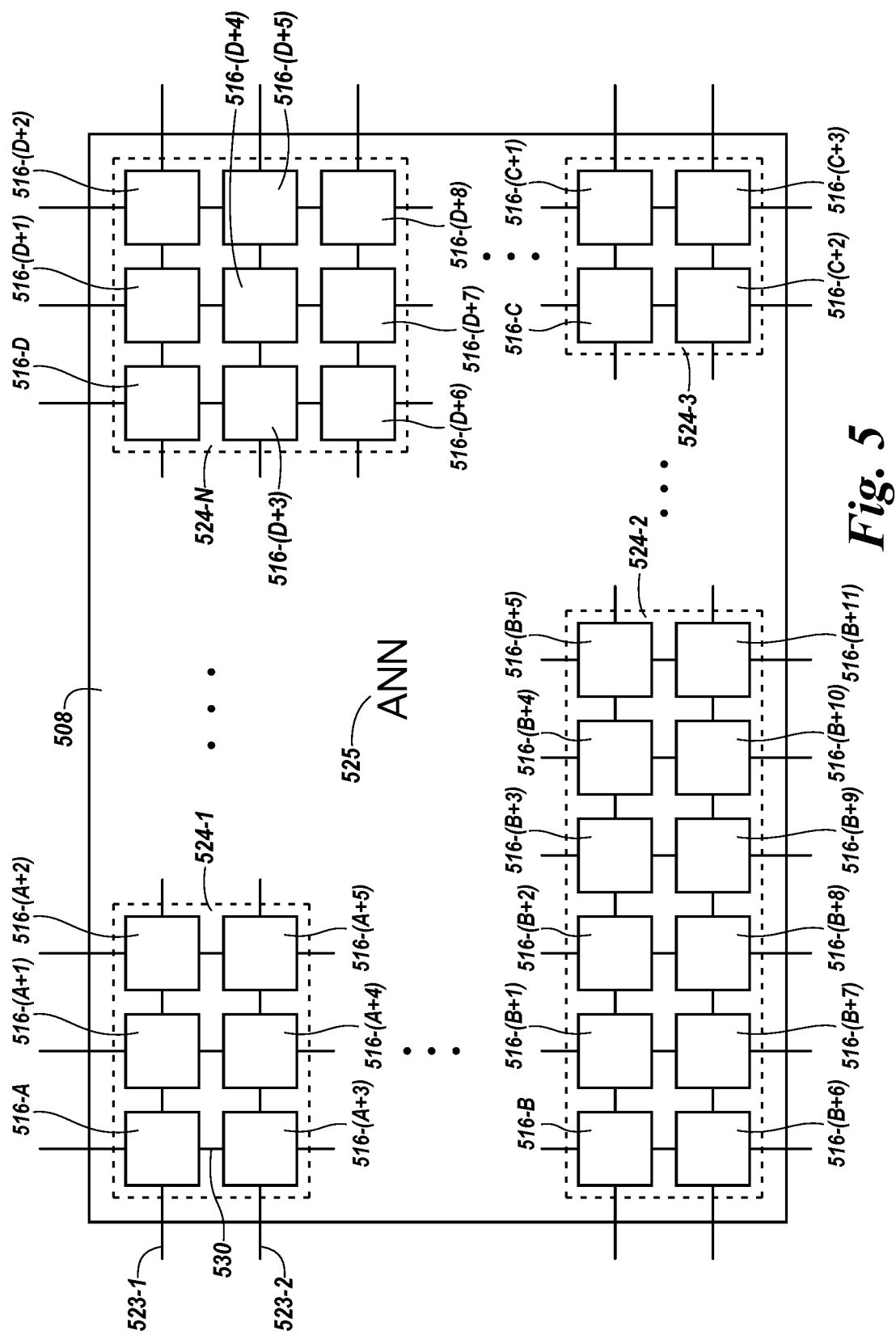
FIG. 5 is a block diagram of a memory device and a number of logic blocks included within the memory device in which an artificial neural network (ANN) is implemented in accordance with a number of embodiments of the present disclosure.

FIG. 5 is a block diagram of a memory device 508 and a number of logic blocks 516 included within the memory device in which an ANN 525 is implemented in accordance with a number of embodiments of the present disclosure. The memory device 508 may be analogous to memory devices 108, 208, and/or 308 as previously described in connection with FIGS. 1, 2, and 3, respectively. The memory device 508 may, in a number of embodiments, represent a plurality of memory devices as described herein (collectively referred to as memory device 508). Each memory device 508 may be in the form of an individual memory die, for example, a DRAM memory die.

As illustrated in FIG. 5 in connection with logic block 516-A, each logic block may include a first data bus 530 coupling a logic block to another logic block and/or a second data bus 523 coupling the logic block another device. For example, data bus 523-1 may couple logic block 516-A to a memory array located internal to the memory device 508 and/or to a controller located external to the memory device 508. Data bus 523-1 coupled to logic block 516-A also may extend beyond the memory device 508 as an example data bus (e.g., an input/output (I/O) boundary) to enable data communication between the memory device 508 and another device located external to the memory system. For example, the memory device 508 may communicate with a host (e.g., host 102 illustrated in FIG. 1) via data buses, such as data buses 523-1 and 523-2 (collectively referred to as data bus 523). Data buses 523 and 530 may thus function as interconnect fiber coupling a set 524-1 of logic blocks 516-A, 516(A+1), . . . , 516-(A+5) to enable an input data path to the logic blocks and an inter-block data path among the logic blocks.

As illustrated in FIG. 5, multiple sets 524-1, 524-2, . . . , 524-N of logic blocks of the ANN 525 may be implemented within memory device 508. For example: a first portion of a plurality of logic blocks 516-A, 516-(A+1), 516-(A+2), 516-(A+3), 516-(A+4), and 516-(A+5) is configured as a first set 524-1; a second portion of the plurality of logic blocks 516-B, 516-(B+1), 516-(B+2), 516-(B+3), 516-(B+4), 516-(B+5), 516-(B+6), 516-(B+7), 516-(B+8), 516-(B+9), 516-(B+10), and 516-(B+11) is configured as a second set 524-2; a third portion of the plurality of logic blocks 516-C, 516-(C+1), 516-(C+2), and 516-(C+3) is configured as a third set 524-3, and a fourth portion of the plurality of logic blocks 516-D, 516-(D+1), 516-(D+2), 516-(D+3), 516-(D+4), 516-(D+5), 516-(D+6), 516-(D+7), and 516-(D+8) is configured as an Nth set 524-N. Accordingly, at least four different sets in the ANN 525 are implemented over the plurality of logic blocks 516 of memory device 508. In a number of embodiments, an ANN 525 may be implemented at a granularity of one or more of the first portion, the second portion, etc., of the plurality of logic blocks each including (e.g., being) a single logic block.

The sets 524-1, 524-2, . . . , 524-N of logic blocks 516 (collectively referred to as sets 524) may have different topologies (e.g., logical topologies). In some embodiments, respective topologies of the sets 524 may correspond to physical topologies of a constituent logic block(s). In an example in which an ANN 525 is implemented over multiple logic blocks, a logical topology of the ANN may correspond to a physical topology of all of or each of the multiple logic blocks (e.g., each set 524 configured as a node of the ANN).

In a number of embodiments, respective topologies of the sets 524 may not correspond to physical topologies of a constituent logic block(s). In this example, a controller (e.g., controller 106 as previously described in connection with FIG. 1) may map (e.g., upon configuring various portions of the memory device 508 as the sets 524) and track a respective topology of each set implemented within the memory device 508 using a lookup table (e.g., lookup table 111 as previously described in connection with FIG. 1), for instance. The controller may also update the mapping information stored in the lookup table responsive to changes in the CLBs of the sets 524. The changes in sets 524 may include changes of constituent CLBs of the sets 524 and/or addition/deletion of sets within ANN 525 the memory device 508.

Multiple sets 524 implemented within the ANN 525 of memory device 508 may be operated independently from each other. Stated differently, multiple ANN operations may be performed concurrently using multiple sets 524 implemented within the memory device 508, as described further herein.

Figure 6:
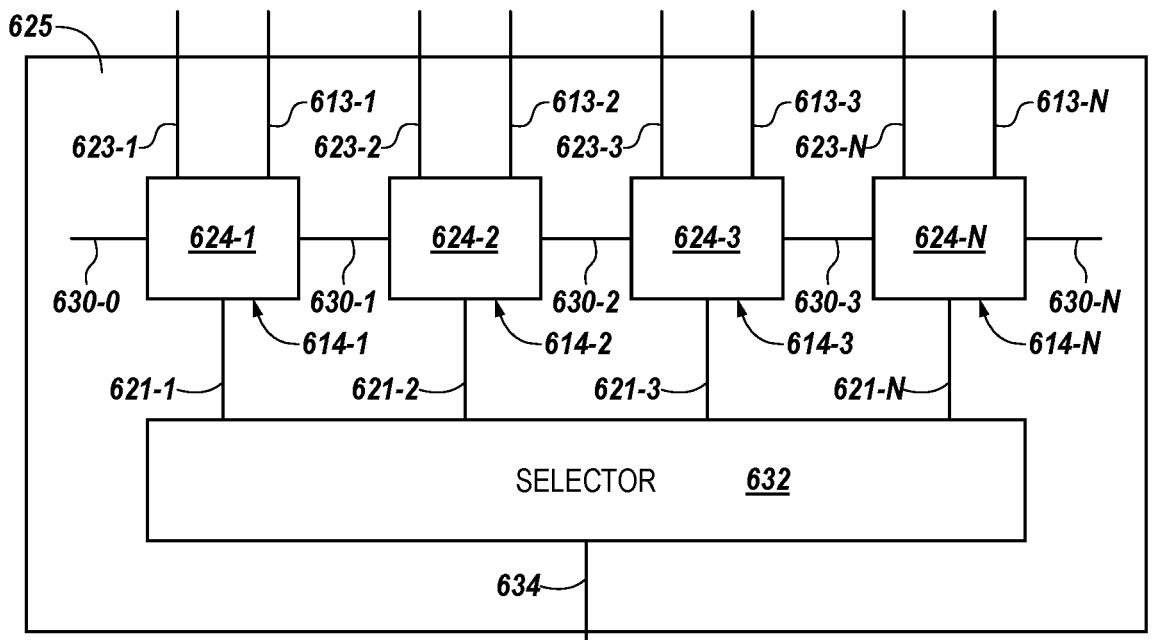
FIG. 6 illustrates an example model of an ANN in accordance with a number of embodiments of the present disclosure.

FIG. 6 illustrates an example model of an ANN 625 in accordance with a number of embodiments of the present disclosure. ANN 625 may include, or be associated with, an input component (not shown) for receiving data values corresponding to one or more sets of biometric identifiers from an array of memory cells. The input component may, in a number of embodiments, be or may be controlled by a processor, as described herein.

The data values for each of the sets (e.g., different types) of biometric identifiers may be provided by the input component to respective sets 624-1, 624-2, . . . , 624-N of logic blocks via a corresponding data bus 623-1, 623-2, . . . , 623-N. In a number of embodiments, each of the sets 624-1, 624-2, . . . , 624-N of logic blocks (e.g., as shown at 516 and described in connection with FIG. 5) may be coupled by respective interconnect fibers 630-0, 630-1, . . . , 630-N to function as data buses to enable an inter-block data path among the logic blocks (e.g., for input and output of data and/or comparison operation results between the sets of logic blocks, among other possibilities).

In a number of embodiments, the sets 624-1, 624-2, . . . , 624-N may be different portions of a plurality of logic blocks in a single layer 614 (e.g., as shown at 314 in FIG. 3) each assigned to handle comparison of a number of particular biometric identifiers related to particular features of a type of biometric. For example, layer 614 may be configured for a facial recognition type of biometric. As such, set 624-1 may, in a number of embodiments, be configured (e.g., with a particular logical topology) for comparison of biometric identifiers related to shapes and/or textures of a nose, set 624-2 may be configured for comparison of shapes and/or textures of a mouth, set 624-3 may be configured for comparison of shapes and/or textures of ears, and set 624-N may be configured for comparison of a hairline (e.g., receding, baldness, etc.), among other possible features for facial recognition.

Accordingly, an example memory device (e.g., memory device 508 of ANN 525 shown and described in connection with FIG. 5) may include an array of memory cells to store a set of biometric identifiers and a plurality of logic blocks configured to match a subset of the set of biometric identifiers by comparison to a stored template (e.g., to one or more of stored templates 209-1, . . . , 209-N shown and described in connection with FIG. 1). A controller (e.g., controller 106 shown and described in connection with FIG. 1) may be coupled to the memory device and may be coupled to the plurality of logic blocks.

The controller may be configured to control a first portion of the plurality of logic blocks to receive a first subset of the set of biometric identifiers from the array in order to perform a first comparison operation thereon. The controller may be further configured to control the first portion of the plurality of logic blocks as an ANN 625 in order to perform the first ANN comparison operation by comparison of the first subset of the plurality of biometric identifiers to the stored template in an attempt to find a match. The controller may be configured to control a second portion of the logic blocks to receive a second subset of the set of biometric identifiers from the array in order to perform a second comparison operation thereon. The controller may be further configured to control the second portion of the plurality of logic blocks as an ANN 625 in order to perform a second ANN comparison operation by comparison of the second subset of the plurality of biometric identifiers to the stored template in an attempt to find a match. The controller may be further configured to control the first portion and the second portion of the plurality of logic blocks to perform the first ANN comparison operation and the second ANN comparison operation concurrently.

The set including the plurality of biometric identifiers may, in a number of embodiments, be data derived from a plurality of features in a static image and/or a dynamic image sensed by a number of sensors (e.g., sensor 105 shown and described in connection with FIG. 1), although embodiments of the ANN comparison operations described herein are not limited such images. The first subset may be a first feature in the image, represented by a number of biometric identifiers, compared by the first ANN operation to a corresponding first feature in the stored template in an attempt to find a first match and the second subset may be a second feature in the image, represented by a number of different biometric identifiers, compared by the second ANN operation to a corresponding second feature in the stored template in an attempt to find a second match. A source of the image may be identifiable when an identity of the first match corresponds to an identity of the second match and the first and second features are different features in the image.

Alternatively, the sets 624-1, 624-2, . . . , 624-N may be different portions of a plurality of logic blocks in respective multiple layers 614-1, 614-2, . . . , 614-N each assigned (e.g., by logic blocks thereof each having a particular logical topology) to handle comparison of a number of particular biometric identifiers related to particular features of corresponding different types of biometrics. For ease of representing both a single layer 614 and multiple layers 614-1, 614-2, . . . , 614-N, the sets 624-1, 624-2, . . . , 624-N of logic blocks are illustrated as being side-by-side. However, in a number of embodiments, the sets 624-1, 624-2, . . . , 624-N may be stacked as respective CMOS layers 614-1, 614-2, . . . , 614-N under the array (e.g., array 312 shown and described in connection with FIG. 3).

Each of the sets 624-1, 624-2, . . . , 624-N of logic blocks, either in the single layer 614 or multiple layers 614-1, 614-2, . . . , 614-N, may be coupled by a respective bus 613-1, 613-2, . . . , 613-N to a stored template for comparison of biometric identifiers (e.g., biometric identifiers 213 shown and described in connection with FIG. 2) received from the array of memory cells. For example, a first type of biometric identifier stored in a first subset of memory cells of the memory device may be compared by logic blocks of set 624-1 to a stored template (e.g., stored template 109-1), which may, in a number of embodiments, be stored on the memory device or on a different memory resource (not shown). A second type of biometric identifier stored in a second subset memory cells may be compared by logic blocks of set 624-2 to the same stored template or to a different stored template (e.g., stored template 109-N), depending on how and/or where data corresponding to the biometric identifiers of the different types is stored and/or configuration of circuitry to enable access to such data concurrently. Alternatively or in addition, the template may be stored on a portable memory resource such as an identification card, a PDA, etc., configured to store such a template. The buses 613-1, 613-2, . . . , 613-N may be coupled (e.g., in a wired or wireless manner) to a port that enables access to the template(s) of such a portable memory resource.

Depending on which of the sets 624-1, 624-2, . . . , 624-N of logic blocks are be used for comparison, results of each of the one or more comparison operations performed using the corresponding sets 624-1, 624-2, . . . , 624-N may be output 621-1, 621-2, . . . , 621-N from the corresponding sets 624-1, 624-2, . . . , 624-N. These results may be output 621-1, 621-2, . . . , 621-N to a selector component 632.

For example, a facial recognition operation may be performed where the set 624-1 of logic blocks is particularly configured to compare biometric identifiers related to shapes and/or textures of a nose, set 624-2 is particularly configured to compare shapes and/or textures of a mouth, set 624-3 is particularly configured to compare shapes and/or textures of an ear or ears, and set 624-N is particularly configured to compare a hairline (e.g., receding, baldness, etc.), among other possible features for facial recognition. Comparison to a stored template (e.g., one template designated for storage of various facial features, although embodiments are not limited to one such template) may yield output 621-1 that provides to a match to a nose of a particular individual, yields output 621-2 that provides a match to a mouth of the same individual, output 621-3 that provides no match to ears of any individual, and output 621-N that that provides a match to a hairline of a different individual. As described herein, the multiple comparison operations may be performed concurrently. In some embodiments, the multiple comparison operations may be performed concurrently in relation to subsets (e.g., corresponding to multiple biometric identifiers) of a particular type of biometric feature (e.g., facial recognition, among possible other types of recognition). The just-described outputs 621 may be provided to the selector component 632.

Because not yielding a match to any individual for a particular facial feature (e.g., no match for an ear biometric identifier in output 621-3) may remove that feature from a collective comparison of biometric identifiers for facial features, the matches based on nose, mouth, and hairline biometric identifier comparisons may provide a set of three matched comparisons, although comparisons to this number of features and/or these biometric identifiers are not so limited. Not yielding a match for a particular biometric identifier described herein may result from the respective feature not being sensed by a sensor (e.g., so the respective comparison operation is not performed) or the feature for the biometric identifier being sensed from a source but a matching biometric identifier not being stored and/or detected in a template, among other possibilities. In this example, the selector component 632 may select the individual identified by the match of the nose biometric identifier and the match of the mouth biometric identifier as the source of the matched biometric identifiers.

The selection by the selector component 632 may be based on obtaining a plurality of matched results by comparison of the subsets of the set of biometric identifiers and selecting one of the plurality of matched results as a source of the set of biometric identifiers, as verified by a majority of the plurality of matched results provided by the ANN 625. Selection of a particular individual may, in a number of embodiments, be based on a match of as few as one biometric identifier or more than two biometric identifiers (e.g., for facial recognition), which may depend on uniqueness and/or commonality of each of the biometric identifiers. Accordingly, such an identification, or lack thereof, may be provided by the selector component 632 as a result 634 of the comparison operation performed using the ANN 625.

The array may store a set of biometric identifiers including the first and second subsets of biometric identifiers (e.g., using an input component controlled by processor 110). The first and second subsets of the biometric identifiers are different biometric identifiers in the set. For example, the first subset may be biometric identifiers related to noses and the second subset may be biometric identifiers related to mouths in a set of facial features usable in a comparison operation for facial recognition. The first and the second comparison operations may potentially determine a match of the first and/or the second subsets respectively to a stored template (e.g., any of a plurality of stored templates 109-1, . . . , 109-N determined to be appropriate for the comparison operation). The plurality of logic blocks (e.g., multiple single logic blocks as shown at 416 in FIG. 4 and/or multiple sets of logic blocks as shown at 524 in FIG. 5) may each be configured as a processing resource to match a subset of the set of biometric identifiers by comparison to a stored template. The controller may be further configured to control a determination (e.g., by the selector component 632) of an identity of a source (e.g., a particular individual) of the set of biometric identifiers based on a first match determined between the first subset of the biometric identifiers and the stored template in combination with a second match determined between the second subset of the biometric identifiers and the stored template.

Another embodiment may include a set of a first type of biometric identifiers (e.g., with one or more subsets for facial recognition) being compared by logic blocks of set 624-1 to a stored template (e.g., stored template 109-1), a set of a second type of biometric identifiers (e.g., with one or more subsets for fingerprint recognition) being compared by logic blocks of set 624-2 to the same stored template or to a different stored template (e.g., stored template 109-N), a set of a third type of biometric identifiers (e.g., with one or more subsets for gait recognition) being compared by logic blocks of set 624-3 to the same stored template or to a different stored template, and a set of a fourth type of biometric identifiers (e.g., with one or more subsets for iris recognition) being compared by logic blocks of set 624-N to the same stored template or to a different stored template. Embodiments are not limited to comparison of these four, or four total, types of biometric identifiers (e.g., for use in identification of an individual). Being compared to the different stored template is intended to mean that each of the types of biometric identifiers may, in a number of embodiments, be compared to an appropriate template that stores information (data) for multiple individuals (sources) based on that particular type of biometric identifier.

In a number of embodiments, one or more subsets of the logic blocks of set 624-1 corresponding to the one or more subsets for facial recognition may be formed (e.g., positioned) in layer 614-1, one or more subsets of the logic blocks of set 624-2 corresponding to the one or more subsets for fingerprint recognition may be formed in layer 614-2, one or more subsets of the logic blocks of set 624-3 corresponding to the one or more subsets for gait recognition may be formed in layer 614-3, and one or more subsets of the logic blocks of set 624-N corresponding to the one or more subsets for iris recognition may be formed in layer 614-N. Embodiments, however, are not limited to use of these four, or four total, separate layers of logic blocks when using multiple layers of logic blocks.

Depending on which of the sets 624-1, 624-2, . . . , 624-N of logic blocks are to be used for comparison, results of each of the one or more comparison operations performed using the corresponding sets 624-1, 624-2, . . . , 624-N may be output 621-1, 621-2, . . . , 621-N from the corresponding sets 624-1, 624-2, . . . , 624-N. These results may be output 621-1, 621-2, . . . , 621-N to the selector component 632 of the ANN 625.

For example, a facial recognition operation may be performed where the 624-1 set of logic blocks is particularly configured to compare biometric identifiers related to a first type of comparison that includes shapes and/or textures of a nose, mouth, ear, and/or hairline, among other possible features for facial recognition. A fingerprint recognition operation may be performed where the 624-2 set of logic blocks is particularly configured to compare biometric identifiers related to a second type of comparison that includes arches, whorls, and/or loops, among various other features for fingerprint recognition. An iris recognition operation may be performed where the 624-3 set of logic blocks is particularly configured to compare biometric identifiers related to a third type of comparison that includes an amount and/or positioning of melanin in the iris (e.g., contributing to eye color) and/or patterns resulting from folds of iris muscles, among various other features for iris recognition. A voice recognition operation may be performed where the 624-N set of logic blocks is particularly configured to compare biometric identifiers related to a fourth type of comparison that includes an individual's behavioral characteristics and/or patterns of speech (e.g., voice pitch, accent, cadence, speaking style, among other possible features for voice recognition). One or more of these biometric identifiers for voice recognition may be influenced by physiological characteristics of a particular speaker (e.g., shape and size of the speaker's mouth and/or throat).

Comparison to a number of appropriate stored templates may yield output 621-1 that provides a match of biometric identifiers related to one or more facial features of a particular individual, output 621-2 that provides a match of biometric identifiers related to one or more fingerprint features of the same individual, output 621-3 that provides no match to an iris of any individual, and output 621-N that that provides a match to a voice of a different individual. The number of stored templates may be a number for separate storage of features related to each of the types of recognition operations being performed, although embodiments are not limited to a particular number of such templates. As described herein, the multiple comparison operations may be performed concurrently. In some embodiments, the multiple comparison operations may be performed concurrently in relation to subsets (e.g., corresponding to multiple biometric identifiers) of a plurality of types of biometric feature (e.g., facial recognition, fingerprint recognition, iris recognition, and/or voice recognition, among possible other types of recognition). The just-described outputs 621 may be provided to the selector component 632 of the ANN 625.

Because not yielding a match to any individual for a particular biometric feature (e.g., no match for an iris biometric identifier in output 621-3) may remove that feature from a collective comparison of biometric identifiers for respective features, the matches based on facial, fingerprint, and voice biometric identifier comparisons may provide a set of three matched biometric identifier comparisons, although comparisons to this number and/or types of features and/or these biometric identifiers are not so limited. In this example, the selector component 632 may select the individual identified by the match of the biometric identifier(s) for the facial features and the match of the biometric identifier(s) for the fingerprint features as the source of the matched biometric identifiers.

The selection by the selector component 632 may be based on obtaining a plurality of matched results by comparison of the types of biometric identifiers in the set and selecting one of the plurality of matched results as a source of the set of biometric identifiers, as verified by being a majority of the plurality of matched results provided by the ANN 625. Selection of a particular individual also may, in a number of embodiments, be based on a match of as few as one type of biometric identifier or more than two types of biometric identifiers, which may depend on uniqueness and/or commonality of each of the biometric identifiers in individuals and/or a total number of individuals whose identities are stored by a template's database, among other possible considerations. Accordingly, such an identification, or lack thereof, may be provided by the selector component 632 as a result 634 of the comparison operation performed using the ANN 625.

The set including the plurality of biometric identifiers may, in a number of embodiments, be data derived from a plurality of features in a plurality of static image and/or a dynamic image sensed by sensor 105, although embodiments of the ANN comparison operations described herein are not limited such images. A first feature, represented by a number of biometric identifiers, in a first image may be sensed using a first modality and a second feature, represented by a number of different biometric identifiers, in a second image may be sensed using a second modality that is different from the first modality. For example, the first feature may be a face of an individual or a subset of the face (e.g., a nose) sensed in a modality of a static image (e.g., by a camera) and the second feature may be a gait of an individual sensed in a modality of a dynamic image (e.g. by a video recorder). Subsets of gait recognition that may be used as biometric identifiers may include a style of walking and/or running, each of which may include step and/or stride length, cadence and/or speed of progression, foot angle, hip angle, and/or angle of forward, backward, and/or sideways lean, among other possibilities (e.g., which may be better derived from the dynamic image modality relative to the static image modality).

Other modalities may be particularly suitable to fingerprint recognition, iris recognition, retinal recognition, body odor recognition, and/or voice recognition, among other possible types of recognition. For example, there are several possible modalities for fingerprint recognition. These modalities include and are selectable from an optical reader (e.g., a digital camera) that is configured to sense and provide a visual image of fingerprints, a capacitive reader (e.g., a CMOS reader) that uses capacitors and electric current to form an image of fingerprints, an ultrasound reader that uses high frequency sound waves to penetrate an outer layer of the skin to form an image of fingerprints from an underlying layer of skin (e.g., that is clean, not scarred, etc.), and a thermal reader that senses, on a contact surface, a difference in temperature between fingerprint ridges and valleys to form an image of fingerprints.

The modality for iris recognition may differ from the modality for retinal recognition. The folding of the muscular ring that creates the random pattern of the iris is an external feature that may be sensed (e.g., photographed on an outside surface of the eye) in a static image using a camera as the modality to detect visible light with sufficient resolution. In contrast, a random pattern made by blood vessels responsible for blood supply of a retina is detectable by sensing the posterior portion of the eye with a sensor (e.g., a retinal scanner) particularly configured to do so as a different modality (e.g., by the retinal scanner including a low energy infrared light source to enable scanning of the retinal pattern).

A first subset may be the first feature in the static image compared by a first ANN comparison operation to a corresponding first feature in a first stored template (e.g., template 109-1) in an attempt to find a first match and a second subset may be the second feature in the dynamic image compared by a second ANN comparison operation to a corresponding second feature in a second stored template (e.g., template 109-N) in an attempt to find a second match. A source of the images may be identifiable when a multi-modal comparison indicates that an identity of the first match corresponds to an identity of the second match.

In a number of embodiments, ANN 625 may include a first layer (e.g., layer 614-1 corresponding to the layer shown at 314 and described in connection with FIG. 3) within which the first portion of the plurality of logic blocks is particularly configured to perform the first ANN comparison operation on the first feature and a second layer (e.g., layer 614-2) stacked on the first layer and within which the second portion of the plurality of logic blocks is particularly configured to perform the second ANN operation on the second feature. ANN 625 also may include a third layer that may be stacked on the second layer. The third layer may be the layer within which an array of memory cells (e.g., as shown at 312 and described in connection with FIG. 3) is formed.

Figure 7:
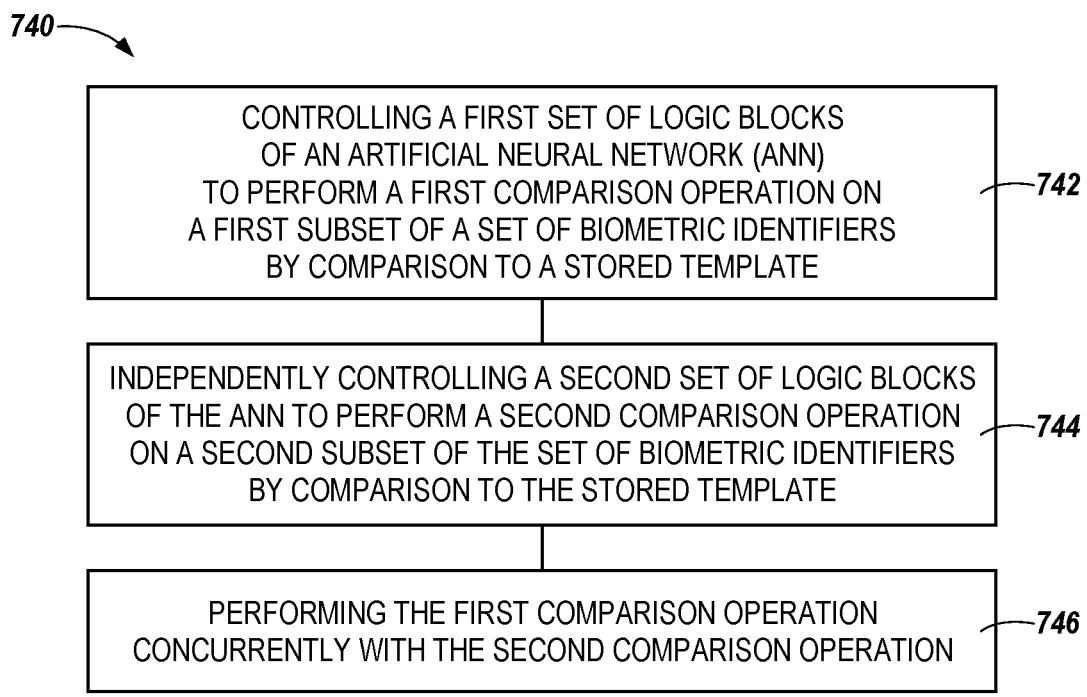
FIG. 7 illustrates an example flow diagram of a method for comparison of biometric identifiers in memory in accordance with a number of embodiments of the present disclosure.

FIG. 7 illustrates an example flow diagram of a method 740 for comparison of biometric identifiers in memory in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At 742, the method 740 may include controlling a first set of logic blocks of an ANN to perform a first comparison operation on a first subset of a set of biometric identifiers by comparison to a stored template (e.g., as described in connection with sets and subsets of logic blocks shown in FIGS. 4-6 and elsewhere herein). At 744, the method 740 may include independently controlling a second set of logic blocks of the ANN to perform a second comparison operation on a second subset of the set of biometric identifiers by comparison to the stored template. At 746, the method 740 may include performing the first comparison operation concurrently with the second comparison operation.

The first set of logic blocks and the second set of logic blocks of the ANN referred to in boxes 742 and 744 may be part of a same memory device (e.g., as shown at 108, 208, 308, and/or 508 and described in connection with FIGS. 1, 2, 3, and 5, respectively). The stored template referred to in boxes 742 and 744 is intended to mean one or more stored templates (e.g., as shown at 109-1, . . . , 109-N and described in connection with FIG. 1 and elsewhere herein), depending on whether all the applicable features corresponding to one type or multiple types of biometric recognition are stored in one template or multiple templates (e.g., each template corresponding to a particular type of recognition).

The method 740 may, in a number of embodiments, further include configuring the memory device to include a first portion of the ANN and a second portion of the ANN, corresponding to the respective first set of logic blocks and the second set of logic blocks, in a CMOS under an array of memory cells (e.g., as shown at 314 and described in connection with FIG. 3 and elsewhere herein). The portions may correspond to the multiple sets of logic blocks shown at 524 and 624 and described in connection with FIGS. 5 and 6, respectively, and/or may correspond to the multiple layers 614 described in connection with FIG. 6. At least one of the plurality of logic blocks may be in each of the first portion and the second portion of the ANN (e.g., as shown in the sets 524 and described in connection with FIGS. 5 and 6). Accordingly, the method may further include receiving data including the first subset of the set of biometric identifiers from the array of memory cells at the first subset of logic blocks and receiving data including the second subset of the set of biometric identifiers from the array of memory cells at the second subset of logic blocks.

The first comparison operation and the second comparison operation may be parts of a plurality of comparison operations performed using corresponding sets of the logic blocks of the ANN. The plurality of comparison operations may be subsets of a recognition operation. For example, a facial recognition operation may be performed using subsets that include comparison of biometric identifiers related to shapes and/or textures of a nose, shapes and/or textures of a mouth, shapes and/or textures of an ear or ears, and/or a hairline, among other possible features for facial recognition.

Alternatively or in addition, the plurality of comparison operations may correspond to performance of multiple different recognition operations as subsets of a combined recognition operation. For example, a facial recognition operation may be performed to compare biometric identifiers related to shapes and/or textures of a nose, mouth, ear, and/or hairline, among other possible features for facial recognition. A fingerprint recognition operation may be performed to compare biometric identifiers related to arches, whorls, and/or loops, among various other features for fingerprint recognition. An iris recognition operation may be performed to compare biometric identifiers related to an amount and/or positioning of melanin in the iris and/or patterns resulting from folds of iris muscles, among various other features for iris recognition. A voice recognition operation may be performed to compare biometric identifiers related to an individual's behavioral characteristics and/or patterns of speech, among other possible features for voice recognition. These multiple different recognition operations may, in a number of embodiments, be used as subsets of a combined recognition operation, as described herein.

The method 740 may further include obtaining a plurality of matched results by comparison of the subsets of the set of biometric identifiers and selecting one of the plurality of matched results as a source of the set of biometric identifiers, as verified by a majority of the plurality of matched results provided by the ANN. The plurality of matched results may, in a number of embodiments, be received by a selector component (e.g., as shown at 632 and described in connection with FIG. 6). The selector component also may perform selecting one of the plurality of matched results as the source (e.g., a particular individual) of the set of biometric identifiers (e.g., as described in connection with FIG. 6).

The method 740 may further include sensing the set of biometric identifiers via a biometric modality and performing the first and the second comparison operations on the respective first and second subsets of the set of biometric identifiers. For example, in a facial recognition operation, a single biometric modality corresponding to one or more static image recording devices (e.g., a number of cameras used as sensors 105) may be used to sense and record subsets of the set of biometric identifiers used for performance of the facial recognition operation. As previously mentioned, these subsets may include shapes and/or textures of a nose, shapes and/or textures of a mouth, shapes and/or textures of an ear or ears, and/or a hairline, among other possible features for facial recognition.

The method 740 may further include sensing the set of biometric identifiers via a plurality of biometric modalities. Types of biometric modalities described herein include, but are not limited to, a static image recording device (e.g., a digital camera) that provides static images (e.g., photographs), a dynamic image recording device that provides dynamic images (e.g., videos), various devices described herein for fingerprint imaging, a sound recording device, an odor sensing device, a retinal scanning device, among various other appropriate types of biometric modalities usable for performance of biometric recognition operations described herein or otherwise.

The plurality of biometric modalities may be used to enable performance of a biometric recognition operation (e.g., to identify and/or authenticate a particular individual) that combines at least two of a facial recognition operation, a gait recognition operation, a fingerprint recognition operation, an iris recognition operation, a retinal recognition operation, and/or a voice recognition operation. For example, a first modality used to enable facial recognition may be a digital camera, a second modality used to enable gait recognition may be a video recorder, a third modality used to enable fingerprint recognition may be a capacitive reader, a fourth modality used to enable retinal recognition may be a retinal scanner, and/or a fifth modality used to enable voice recognition may be a sound recording device. Accordingly, a first and a second comparison operation may be performed on respective first and second subsets of at least two of a set of biometric identifiers in a plurality of combinations of biometric recognition operations. In a number of embodiments, other recognition operations and/or modalities described herein or otherwise may be added and/or removed from this group of recognition operations and modalities (e.g., as appropriate to the intended certainty, convenience, and/or security of the combined recognition operation).

Figure 8:
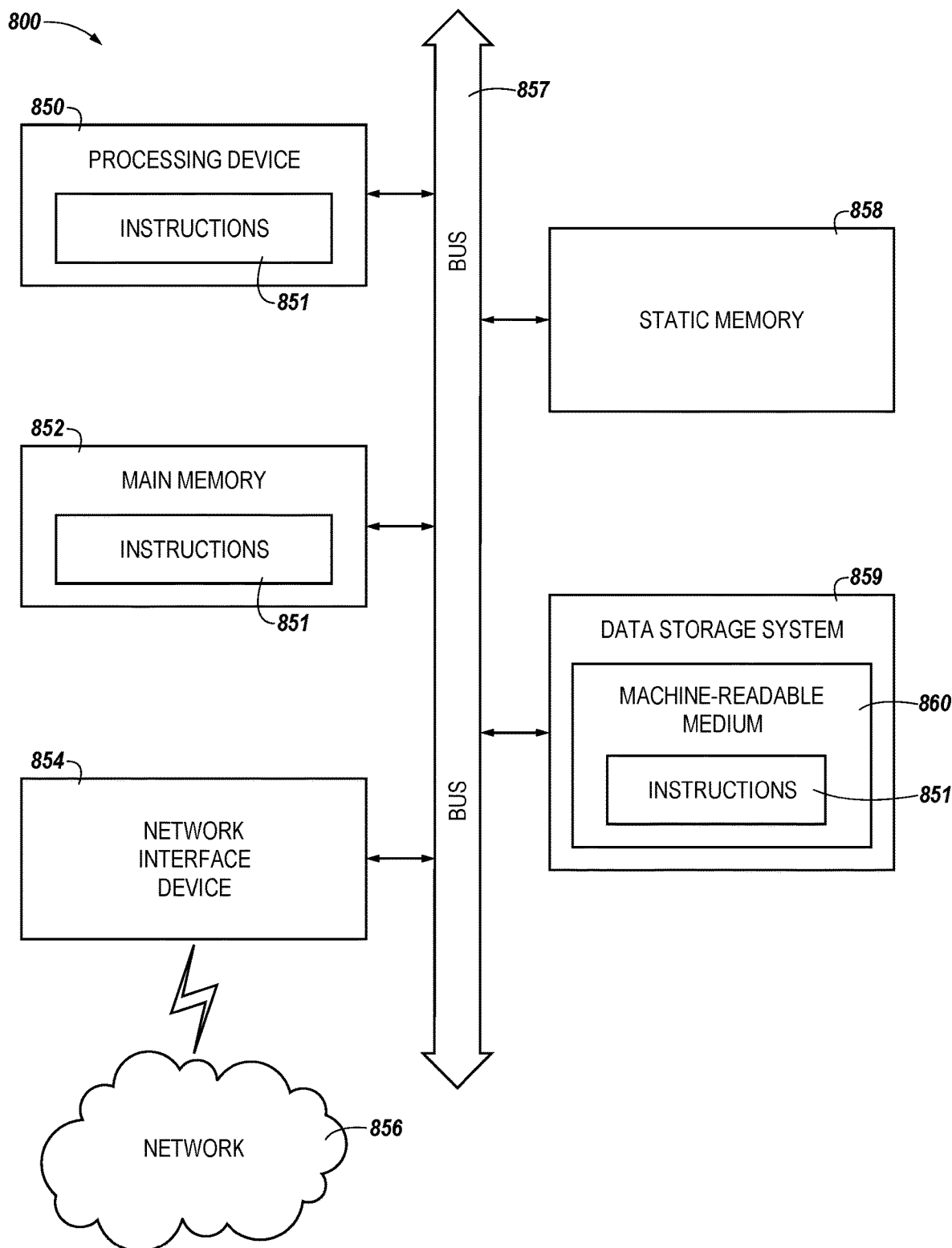
FIG. 8 illustrates an example machine of a computer system within which a set of instructions, for causing the machine to perform various methodologies discussed herein, may be executed.

FIG. 8 illustrates an example machine of a computer system 800 within which a set of instructions, for causing the machine to perform various methodologies discussed herein, may be executed. In various embodiments, the computer system 800 may correspond to a system (e.g., system 100 of FIG. 1) that includes, is coupled to, or utilizes a memory sub-system (e.g., memory system 104 of FIG. 1) or may be used to perform the operations of a controller (e.g., controller 106 of FIG. 1). In alternative embodiments, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a PDA, a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 850, a main memory 852 (e.g., read-only memory (ROM), flash memory, dynamic random access memory (DRAM) such as synchronous DRAM (SDRAM) or Rambus DRAM (RDRAM), etc.), a static memory 858 (e.g., flash memory, static random access memory (SRAM), etc.), and a data storage system 859, which communicate with each other via a bus 857.

Processing device 850 represents one or more general-purpose processing devices such as a microprocessor, a central processing unit (CPU), or the like. More particularly, the processing device 850 may be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 850 also may be one or more special-purpose processing devices such as an application specific integrated circuit (ASIC), a field programmable gate array (FPGA), a digital signal processor (DSP), network processor, or the like. The processing device 850 is configured to execute instructions 851 for performing the operations and steps discussed herein. The computer system 800 may further include a network interface device 854 to communicate over a network 856.

The data storage system 859 may include a machine-readable storage medium 860 (also known as a computer-readable medium) on which is stored one or more sets of instructions 851 or software embodying any one or more of the methodologies or functions described herein. The instructions 851 may also reside, completely or at least partially, within the main memory 852 and/or within the processing device 850 during execution thereof by the computer system 800, the main memory 852 and the processing device 850 also constituting machine-readable storage media.

In a number of embodiments, the instructions 851 may include instructions to implement functionality corresponding to the host 102 and/or the memory system 104 of FIG. 1. While the machine-readable storage medium 860 is shown in an example embodiment to be a single medium, the term "machine-readable storage medium" should be taken to include a single medium or multiple media that store the one or more sets of instructions. The term "machine-readable storage medium" also shall be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Figure 9:
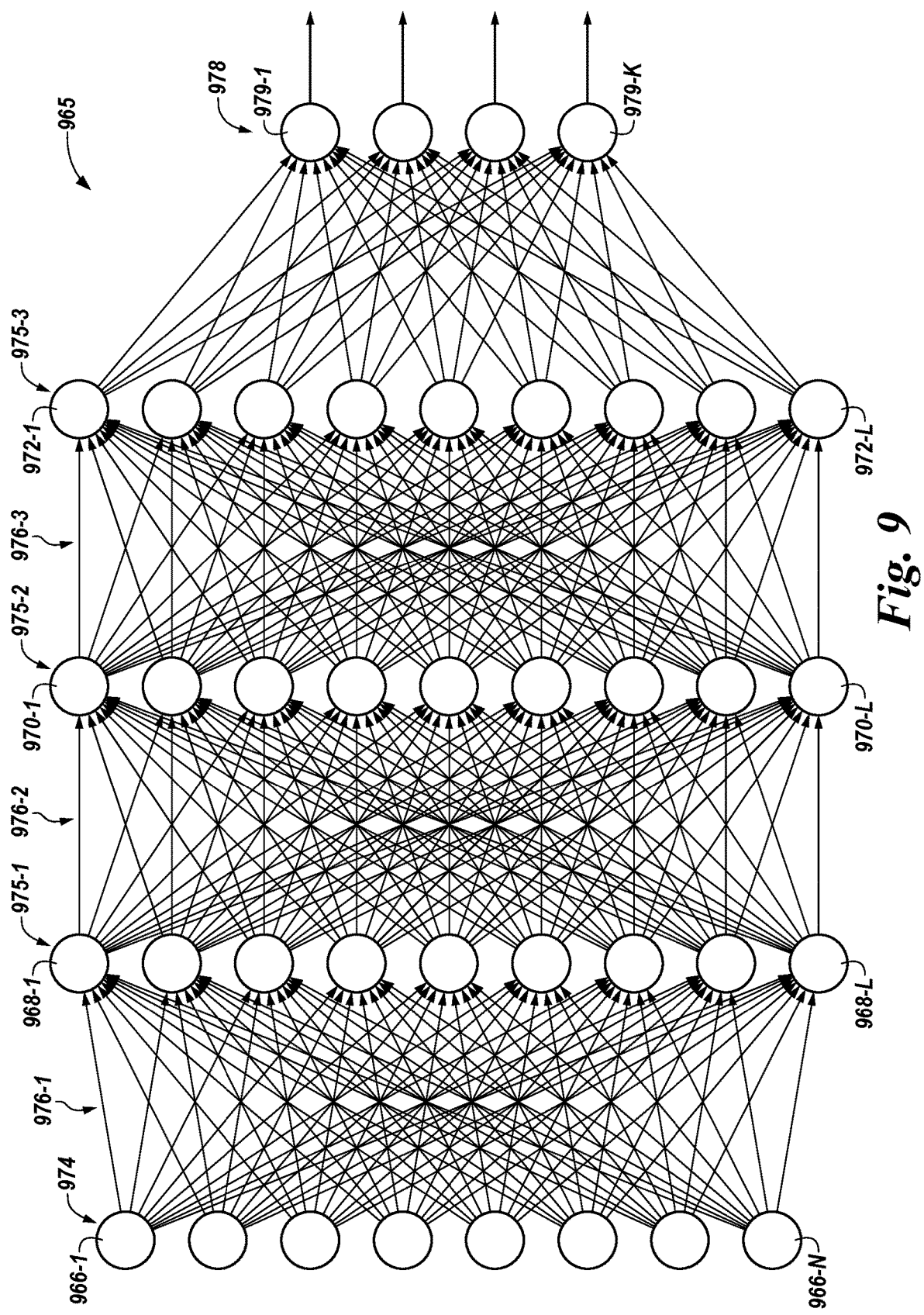
FIG. 9 illustrates another example model of an ANN in accordance with a number of embodiments of the present invention.

FIG. 9 illustrates another example model of an ANN 965 in accordance with a number of embodiments of the present invention. ANN 965 can include an ANN layer 974 (e.g., input layer) having nodes 966-1 to 966-N that receive various inputs, such as inputs x1 to xN as previously described in connection with FIG. 2. Nodes of each ANN layer (e.g., ANN layers 974, 975-1, 975-2, and 975-3, and 978) can correspond to artificial neurons as described herein.

ANN 965 can include ANN layers 975-1 to 975-3. ANN layer 975-1 can include nodes 968-1 to 968-L. As illustrated in an interconnection region 976-1, each of the respective nodes 968-1 to 968-L can be coupled to receive inputs from nodes 966-1 to 966-N. ANN layer 975-2 can include nodes 970-1 to 970-L. As illustrated in an interconnection region 976-2, each of the respective nodes 970-1 to 970-L can be coupled to receive inputs from nodes 968-1 to 968-L. ANN layer 975-3 can include nodes 972-1 to 972-L. As illustrated in an interconnection region 976-3, each of the respective nodes 972-1 to 972-L can be coupled to receive inputs from nodes 970-1 to 970-L. The ANN 965 may be configured in a training process in which the various connections in the interconnection regions 976 are assigned a weight value or updated with a new weight value that is used for operations or computations at nodes 968, 970, or 972. The training process may be different depending on a particular application or use of the ANN 965. For instance, an ANN may be trained for image recognition, speech recognition, or any number of other processing or computational tasks.

ANN 965 can include an output layer 978 having output nodes 979-1 to 979-K. Each of the respective output nodes 979-1 to 979-K can be coupled to receive inputs from nodes 972-1 to 972-L. The process of receiving usable outputs at output layer 978 and output nodes 979 as a result of inputs fed into nodes 966 at ANN layer 974 may be referred to as inference or forward propagation. That is, input signals representative of some real world phenomena or application may be fed into a trained ANN 965 and through inference that occurs as a result of calculations enabled by various nodes and interconnects, a result may be output. In the case of an ANN 965 trained for speech recognition, the input may be signals representative of human speech in one language, and the output may be signals representative of human speech in a different language. Or for an ANN 965 trained for image recognition, the input may be signals representative of a photograph and the output may be signals representative of the subject in the photograph.

As described herein, multiple ANNs may be configured within a memory device. The multiple ANNs may be separately trained (either locally or remotely) and the trained ANNs may be used for inference within the memory device.

The multiple ANNs may perform the same or different functions. They may have the same or different weights relative to one another.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" or "multiple" are intended to refer to more than one of such things. Furthermore, the words "may" and "can" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, may include a wireless connection for access to and/or for movement (transmission) of instructions (e.g., control signals, address signals, etc.) and data, as appropriate to the context.

While example embodiments including various combinations and configurations of structural materials, logic blocks, recognition operations, biometric identifiers, biometric modalities, controllers, processing resources, types of input, stored templates, memory devices, and arrays of memory cells, among other materials and/or components related to comparison of biometric identifiers in memory have been illustrated and described herein, embodiments of the present disclosure are not limited to those combinations explicitly recited herein. Other combinations and configurations of the structural materials, logic blocks, recognition operations, biometric identifiers, biometric modalities, controllers, processing resources, types of input, stored templates, memory devices, and arrays of memory cells, among other materials and/or components related to comparison of biometric identifiers in memory than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of various embodiments of the present disclosure. As will be appreciated, elements shown in the various embodiments herein may be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    an array of memory cells;
    a plurality of logic blocks in complementary metal-oxide-semiconductor (CMOS) under the array; and
    a controller coupled to the array of memory cells, wherein the controller is configured to:
        control a first portion of the plurality of logic blocks to receive a first subset of a set of biometric identifiers from the array and to perform a first comparison operation thereon; and
        control a second portion of the logic blocks to receive a second subset of the set of biometric identifiers from the array and to perform a second comparison operation thereon; wherein
    the first and second subsets of the biometric identifiers are different biometric identifiers; and
    the first and second comparison operations are performed to determine a match of the first and second subsets respectively to a stored template;
    wherein the controller further comprises a processor configured to selectably store input of the first and second subsets of biometric identifiers in subsets of memory cells in the array, wherein the subsets of memory cells correspond to respective subsets of the set of biometric identifiers;
    wherein the controller is further configured to control:
        the first portion of the plurality of logic blocks to receive the first subset of the biometric identifiers moved from a corresponding first subset of memory cells via a first data bus; and
        the second portion of the plurality of logic blocks to receive the second subset of the biometric identifiers moved from a corresponding second subset of memory cells via a second data bus.

2. The apparatus of claim 1, wherein the first and second comparison operations are performed to determine a match of the first and second subsets respectively to any of a plurality of stored templates.

3. The apparatus of claim 1, wherein the controller is configured to store a set of biometric identifiers, comprising the first and second subsets of biometric identifiers, in the array.

4. The apparatus of claim 1, wherein the plurality of logic blocks is each configured to match a subset of a set of biometric identifiers by comparison to the stored template.

5. The apparatus of claim 1, wherein the controller is further configured to control a determination of an identity of a source of a set of biometric identifiers based on a first match determined between the first subset of the biometric identifiers and the stored template in combination with a second match determined between the second subset of the biometric identifiers and the stored template.

6. The apparatus of claim 1, wherein the apparatus further comprises a sensor configured to sense a set of biometric identifiers from a source.

7. The apparatus of claim 1, wherein the first portion and the second portion of the plurality of logic blocks are each a respective single logic block.

8. The apparatus of claim 1, wherein at least one of the plurality of logic blocks is a configurable logic block (CLB).

9. An apparatus, comprising:
a plurality of logic blocks of a memory device; and
a controller coupled to the plurality of logic blocks, wherein the controller is configured to:
control a first portion of the plurality of logic blocks as an artificial neural network (ANN) to perform a first ANN operation, wherein the first ANN operation is comparison of a first subset of a plurality of biometric identifiers to a first stored template to find a match;
control a second portion of the plurality of logic blocks as an ANN to perform a second ANN operation, wherein the second ANN operation is comparison of a second subset of the plurality of biometric identifiers to a second stored template to find a match; and
control the first portion and the second portion of the plurality of logic blocks to perform the first ANN operation and the second ANN operation concurrently;
wherein the plurality of biometric identifiers is data derived from features in a plurality of images;
wherein a first feature in a first image is sensed using a first modality and a second feature in a second image is sensed using a second modality that is different from the first modality;
wherein the first subset is the first feature in the first image compared by the first ANN operation to a corresponding first feature in the first stored template to find a first match;
wherein the second subset is the second feature in the second image compared by the second ANN operation to a corresponding second feature in the second stored template to find a second match; and
wherein a source of the image is identifiable when a multi-modal comparison indicates that an identity of the first match corresponds to an identity of the second match.

10. The apparatus of claim 9, wherein the memory device further comprises:
a first layer within which the plurality of logic blocks is formed; and
a second layer stacked on the first layer and within which an array of memory cells is formed.

11. The apparatus of claim 10, wherein the first layer comprises the plurality of logic blocks formed as a complementary metal-oxide-semiconductor (CMOS) under the array.

12. The apparatus of claim 10, wherein the array of memory cells comprises an array of dynamic random access memory (DRAM) cells in a DRAM device.

13. The apparatus of claim 9, wherein the memory device further comprises:
a first layer within which the first portion of the plurality of logic blocks is particularly configured to perform the first ANN operation on the first feature;
a second layer stacked on the first layer and within which the second portion of the plurality of logic blocks is particularly configured to perform the second ANN operation on the second feature; and
a third layer stacked on the second layer and within which an array of memory cells is formed.

14. The apparatus of claim 9, wherein the first stored template is stored on the memory device.

15. The apparatus of claim 9, wherein the first stored template is stored on a memory resource coupled to the memory device.

16. The apparatus of claim 9, wherein the first stored template is stored on a portable memory resource presentable to the apparatus.

17. A method, comprising:
controlling a first set of logic blocks of an artificial neural network (ANN) to perform a first comparison operation on a first subset of a set of biometric identifiers by comparison to a first stored template;
controlling a second set of logic blocks of the ANN to perform a second comparison operation on a second subset of the set of biometric identifiers by comparison to a second stored template;
performing the first comparison operation concurrently with the second comparison operation;
wherein the first set of logic blocks and the second set of logic blocks of the ANN are part of a same memory device;
wherein the set of biometric identifiers is data derived from features in a plurality of images;
sensing a first feature in a first image using a first modality;
sensing a second feature in a second image using a second modality that is different from the first modality;
wherein the first subset is the first feature in the first image compared by the first comparison operation to a corresponding first feature in the first stored template to find a first match;
wherein the second subset is the second feature in the second image compared by the second comparison operation to a corresponding second feature in the second stored template to find a second match; and
wherein a source of the image is identifiable when a multi-modal comparison indicates that an identity of the first match corresponds to an identity of the second match.

18. The method of claim 17, further comprising:
configuring the memory device to include a first portion of the ANN and a second portion of the ANN, corresponding to the respective first set of logic blocks and the second set of logic blocks, in a complimentary metal-oxide-semiconductor (CMOS) under an array of memory cells; and
including at least one of the plurality of logic blocks in each of the first portion and the second portion of the ANN.

19. The method of claim 18, further comprising:
receiving data comprising the first subset of the set of biometric identifiers from the array of memory cells at the first subset of logic blocks; and receiving data comprising the second subset of the set of biometric identifiers from the array of memory cells at the second subset of logic blocks.

20. The method of claim 17, wherein the first comparison operation and the second comparison operation are part of a plurality of comparison operations performed using corresponding sets of the logic blocks of the ANN, and wherein the method further comprises:
obtaining a plurality of matched results by comparison of the subsets of the set of biometric identifiers; and
selecting one of the plurality of matched results as a source of the set of biometric identifiers, as verified by a majority of the plurality of matched results provided by the ANN.

21. The method of claim 17, further comprising:
sensing the set of biometric identifiers via a biometric modality; and
performing the first and the second comparison operations on the respective first and second subsets of the set of biometric identifiers.

22. The method of claim 17, further comprising:
sensing the set of biometric identifiers via a plurality of biometric modalities comprising at least two of:
facial recognition;
fingerprint recognition;
gait recognition;
iris recognition;
retinal recognition; or
voice recognition; and
performing the first and the second comparison operations on the respective first and second subsets of the at least two of the set of biometric identifiers.

23. An apparatus, comprising:
an array of memory cells;
a plurality of logic blocks in complementary metal-oxide-semiconductor (CMOS) under the array; and
a controller coupled to the array of memory cells, wherein the controller is configured to:
control a first portion of the plurality of logic blocks to receive a first subset of a set of biometric identifiers from the array and to perform a first comparison operation thereon; and
control a second portion of the logic blocks to receive a second subset of the set of biometric identifiers from the array and to perform a second comparison operation thereon; wherein
the first and second subsets of the biometric identifiers are different biometric identifiers; and
the first and second comparison operations are performed to determine a match of the first and second subsets respectively to a stored template;

wherein the controller further comprises a processor configured to selectably:
determine from a set of biometric identifiers a type of input to be identified; and
determine from the type of input a plurality of subsets of the biometric identifiers to be compared for identification;
the controller is further configured to control:
movement of the first subset of the biometric identifiers to the first portion of the plurality of logic blocks based on the first portion being particularly configured to compare the first subset to the stored template; and
movement of the second subset of the biometric identifiers to the second portion of the plurality of logic blocks based on the second portion being particularly configured to compare the second subset to the stored template.

24. An apparatus, comprising:
a plurality of logic blocks of a memory device; and
a controller coupled to the plurality of logic blocks, wherein the controller is configured to:
control a first portion of the plurality of logic blocks as an artificial neural network (ANN) to perform a first ANN operation, wherein the first ANN operation is comparison of a first subset of a plurality of biometric identifiers to the stored template to find a match;
control a second portion of the plurality of logic blocks as an ANN to perform a second ANN operation, wherein the second ANN operation is comparison of a second subset of the plurality of biometric identifiers to the stored template to find a match; and
control the first portion and the second portion of the plurality of logic blocks to perform the first ANN operation and the second ANN operation concurrently;
wherein the plurality of biometric identifiers is data derived from a plurality of features in an image;
wherein the first subset is a first feature in the image compared by the first ANN operation to a corresponding first feature in the stored template to find a first match;
wherein the second subset is a second feature in the image compared by the second ANN operation to a corresponding second feature in the stored template to find a second match;
wherein a source of the image is identifiable when an identity of the first match corresponds to an identity of the second match; and
wherein the first and second features are different features in the image.

* * * * *